(12) United States Patent
Lin

(10) Patent No.: US 8,378,225 B2
(45) Date of Patent: Feb. 19, 2013

(54) PRINTED CIRCUIT BOARD AND METHOD FOR FABRICATING THE SAME

(75) Inventor: Hsien-Chieh Lin, Taoyuan (TW)

(73) Assignee: Nan Ya PCB Corp., Taoyuan County (TW)

( * ) Notice: Subject to any disclaimer, the term of this patent is extended or adjusted under 35 U.S.C. 154(b) by 548 days.

(21) Appl. No.: 12/563,975

(22) Filed: Sep. 21, 2009

(65) Prior Publication Data

US 2011/0036620 A1 Feb. 17, 2011

(30) Foreign Application Priority Data

Aug. 17, 2009 (TW) .............................. 98127576 A

(51) Int. Cl.
*H05K 1/03* (2006.01)
(52) U.S. Cl. ...................................................... 174/256
(58) Field of Classification Search .................. 174/256, 174/261; 228/212; 257/737–738
See application file for complete search history.

(56) References Cited

U.S. PATENT DOCUMENTS 7,521,800 B2 * 4/2009 Chu et al. ...................... 257/738
2005/0023680 A1 * 2/2005 Wang et al. ................... 257/737

* cited by examiner

*Primary Examiner* — Jeremy Norris
*Assistant Examiner* — Tremesha S Willis

(57) ABSTRACT

The invention provides a printed circuit board and method for fabricating the same. The printed circuit board includes a substrate having an internal circuit structure. An additional circuit structure is disposed on the substrate, electrically connected to the internal circuit structure. A solder mask insulating layer having an opening is disposed on the additional circuit structure. A conductive bump pattern is disposed in the solder mask insulating layer, wherein the conductive bump pattern extends into the opening horizontally, wherein a side, a portion of an upper surface and a portion of a lower surface of the conductive bump pattern are exposed from the opening. A solder ball is formed in the opening, wherein the solder ball is electrically connected to the additional circuit structure.

19 Claims, 11 Drawing Sheets

PRINTED CIRCUIT BOARD AND METHOD FOR FABRICATING THE SAME

CROSS REFERENCE TO RELATED APPLICATIONS

This Application claims priority of Taiwan Patent Application No. 98127576, filed on Aug. 17, 2009, the entirety of which is incorporated by reference herein.

BACKGROUND OF THE INVENTION

1. Field of the Invention

The present invention relates to a printed circuit board and method for fabricating the same, and in particular, to a blind hole structure of a printed circuit board and method for fabricating the same.

2. Description of the Related Art

FIG. 1 is a cross section view showing a conventional printed circuit board 50. Solder balls 136 of the conventional printed circuit board 50 are formed in openings 128 of a solder mask insulating layer 116 by a conventional solder ball mount process. The conventional solder ball mount process comprises, disposing a printing mold having openings over the solder mask insulating layer. Next, solder paste is scraped or squeezed into the openings of the printing mold, covering surfaces of the solder mask insulating layer 116 and the openings 128. Next, the solder paste on the surfaces of the solder mask insulating layer and in the openings 128 is melted by a reflow process, wherein forming solder balls 136 in the openings 128 of the solder mask insulating layer 116. The conventional solder ball 136, however, only contact the circuit 110 exposed from a bottom side of the opening 128. Thus, if solder paste amount or pressure applied on the printing mold is not enough, some problems of the solder balls, for example, insufficient volume or skip printing, would occur, wherein decreasing reliability of the printed circuit board.

Thus, a novel printed circuit board and method for fabricating the same with improved reliability are desired.

BRIEF SUMMARY OF INVENTION

A printed circuit board and method for fabricating the same are provided. An exemplary embodiment of a printed circuit board comprises a substrate having an internal circuit structure. An additional circuit structure is disposed on the substrate, electrically connected to the internal circuit structure. A solder mask insulating layer having an opening is disposed on the additional circuit structure. A conductive bump pattern is disposed in the solder mask insulating layer, wherein the conductive bump pattern extends into the opening horizontally, wherein a side, a portion of an upper surface and a portion of a lower surface of the conductive bump pattern are exposed from the opening from the opening. A solder ball is formed in the opening, wherein the solder ball is electrically connected to the additional circuit structure.

An exemplary embodiment of a method for fabricating a printed circuit board comprises providing a substrate having an internal circuit structure. An additional circuit structure is formed on the substrate, wherein the additional circuit structure is electrically connected to the internal circuit structure. A first solder mask insulating layer, a conductive bump pattern and a second solder mask insulating layer are sequentially formed on the additional circuit structure. An opening is formed in the first and second solder mask insulating layers, wherein a side, a portion of an upper surface and a portion of a lower surface of the conductive bump pattern are exposed from the opening from the opening. A solder ball is formed in the opening, wherein the solder ball is electrically connected to the additional circuit structure.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein:

FIGS. 2-4a, 4b and 5-9 are cross section views for fabricating one exemplary embodiment of a printed circuit board of the invention.

DETAILED DESCRIPTION OF INVENTION

Figure 1:
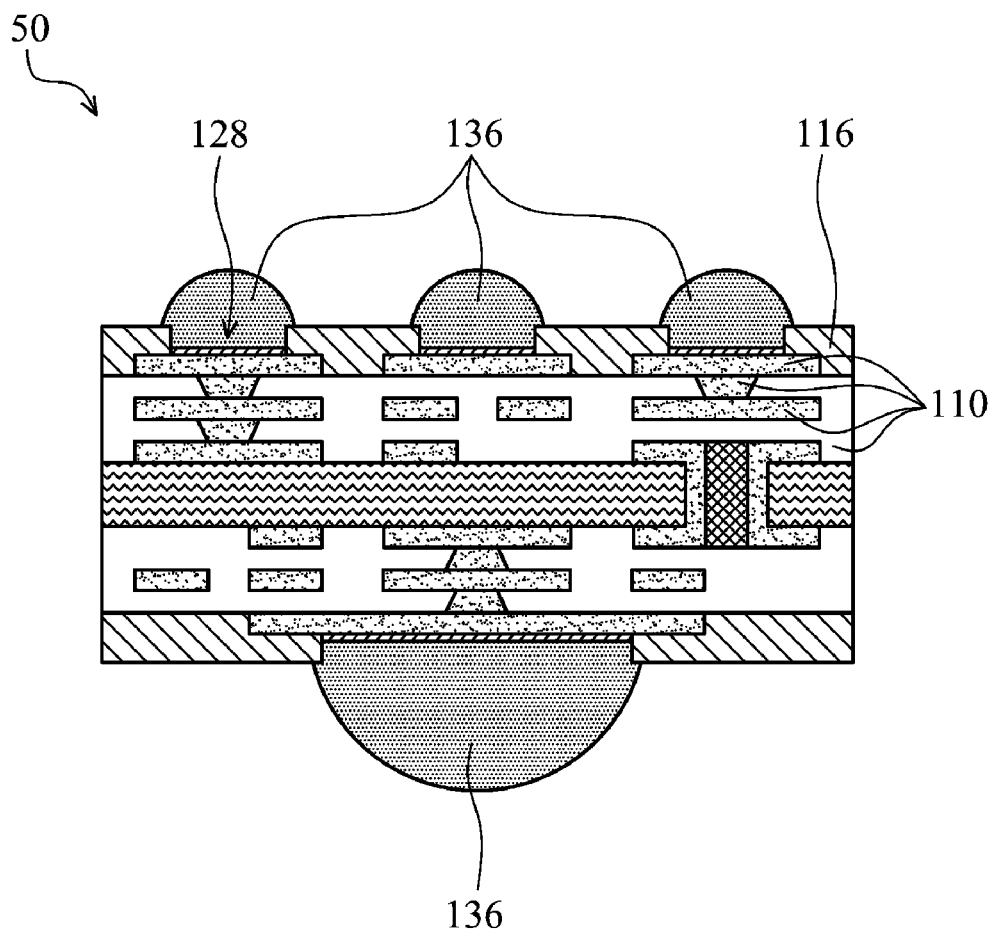
FIG. 1 is a cross section view showing a conventional printed circuit board.

The following description is of a mode for carrying out the invention. This description is made for the purpose of illustrating the general principles of the invention and should not be taken in a limiting sense. The scope of the invention is best determined by reference to the appended claims. Wherever possible, the same reference numbers are used in the drawings and the descriptions to refer the same or like parts.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated and not drawn to scale for illustrative purposes. The dimensions and the relative dimensions do not correspond to actual dimensions to practice the invention.

Figure 2:
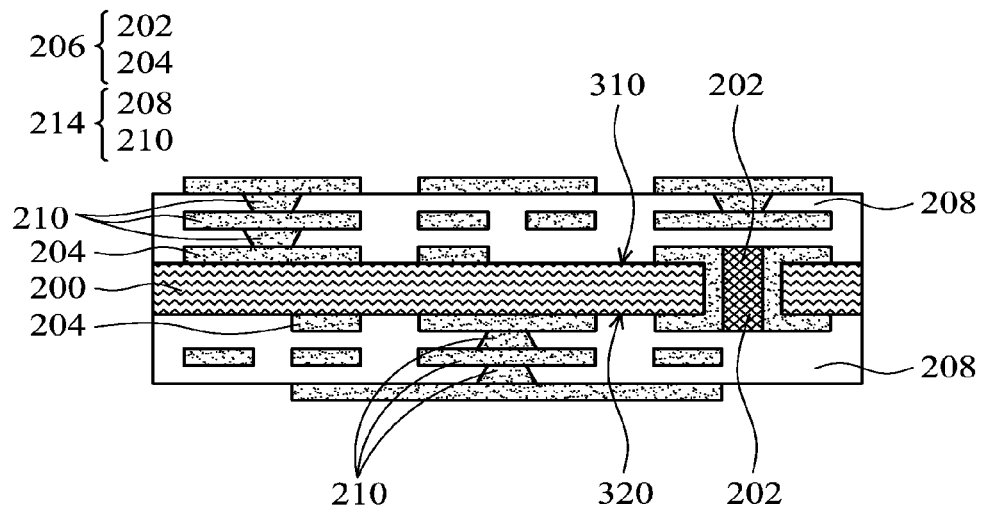

FIGS. 2-4a, 4b and 5-9 are cross section views for fabricating one exemplary embodiment of a printed circuit board 500 of the invention. One exemplary embodiment of a printed circuit board has conductive bump patterns disposed in a solder mask insulating layer to increase roughness of openings of the solder mask insulating layer, wherein the bonding strength between solder balls disposed in the openings and a circuit substrate is improved. Referring to FIG. 2, a substrate 200 having an internal circuit structure 206 is provided. In one embodiment, the substrate 200 may comprise a core material of paper phenolic resin, composite epoxy, polyimide resin or glass fiber. In one embodiment, the internal circuit structure 206 may comprise a through hole 202 and a patterned trace layer 204. Additionally, the patterned trace layer 204 may comprise Ni, Au, Sn, Pb, Cu, Ag, Cr, W, combinations thereof or alloys thereof. A formation method of the patterned trace layer 204 may comprise entirely forming conductive layers (not shown) on a first surface 310 and an opposite second surface 320 of the substrate 200 using plating, laminating, coating or other well-known methods, respectively. In one embodiment, the first surface 310 may serve as a wafer-side surface 310, and the second surface 320 may serve as a carrier-side surface 320. Next, the patterned trace layers 204 are respectively formed on the first surface 310 and the second surface 320 of the substrate 200 by an image transfer process comprising photoresist covering, developing, etching and photoresist striping.

Next, additional circuit structures 214 comprising circuits and/or blind holes 210 and dielectric layers 208 are formed on the patterned trace layers 204. The dielectric layers 208 may be entirely and respectively formed on the first surface 310 and the second surface 320 of the substrate 200, wherein the dielectric layer 208 may comprise epoxy resin, bismaleimide triacine (BT), polyimide, an ajinomoto build-up (ABF) film, poly phenylene oxide (PPE) or polytetrafluorethylene (PTFE). Next, a plurality of holes, which may provide formation positions of the circuits and/or blind holes 210 of the following additional circuit structures 214, is formed on the dielectric layers 208 by laser drilling. Next, conductive layers are formed on the dielectric layers 208 and in the holes, wherein the conductive layer may comprise Ni, Au, Sn, Pb, Cu, Ag, Cr, W, combinations thereof or alloys thereof. Next, the additional circuits and/or blind holes 210 of the additional circuit structures 214 may be formed on the dielectric layer 208 and in the holes by a patterned process. The additional circuits and/or blind holes 210 are electrically connected to the internal circuit structure 206.

Figure 3:
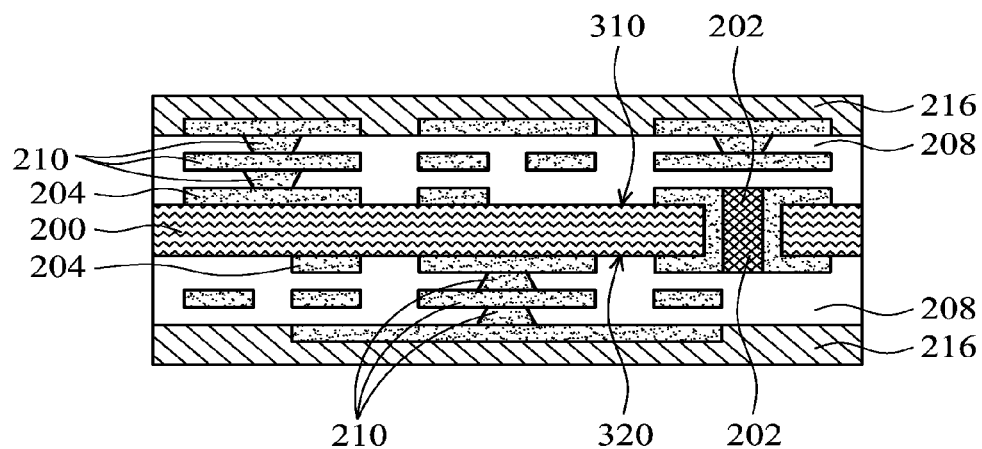

Next, referring to FIG. 3, first solder mask insulating layers 216 are formed on the additional circuit structures 214 by a coating process. In one embodiment, the first solder mask insulating layers 216 may comprise materials such as a solder mask to protect the underlying circuits and/or blind holes 210 from oxidation and short circuiting.

Figure 4A:
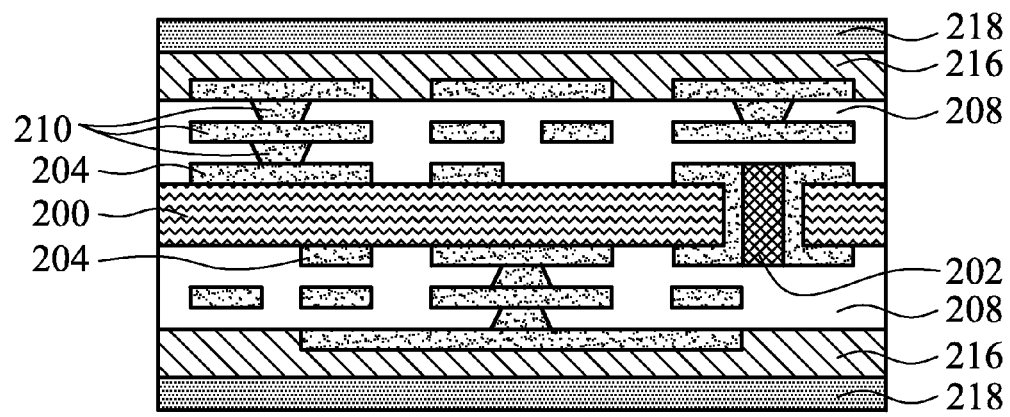
Figure 4B:
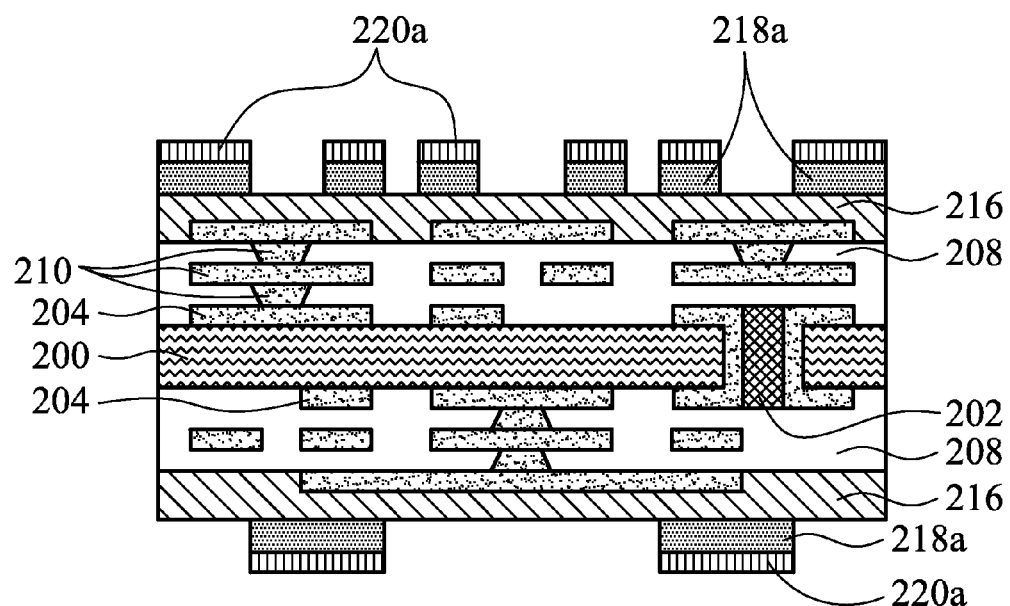

FIGS. 4a and 4b show a method for fabricating one exemplary embodiment of conductive bump patterns 218a. As shown in FIG. 4a, conductive layers 218 may be formed on the first solder mask insulating layers 216 by a pasting process. In one embodiment, the conductive layer 218 may comprise Ni, Au, Sn, Pb, Cu, Ag, Cr, W, combinations thereof or alloys thereof. Next, as shown in FIG. 4b, photoresist layers (not shown) may cover the conductive layers 218 by a pasting process. A developing process is then performed to form photoresist patterns 220a on the conductive layers 218. Next, an etching process is performed to the conductive layers 218 not covered by the photoresist patterns 220a, wherein the conductive bump patterns 218a are formed isolated from each other. Finally, a stripping process is performed to remove the photoresist patterns 220a.

Figure 5A:
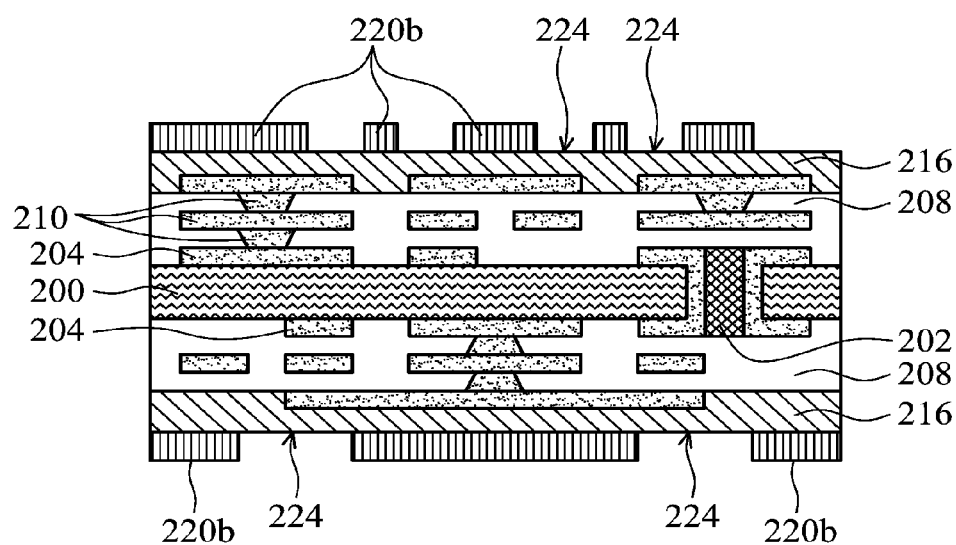
FIGS. 5a and 5b are cross section views of another exemplary embodiment of a printed circuit board of the invention showing another method for fabricating a conductive bump pattern.
Figure 5B:
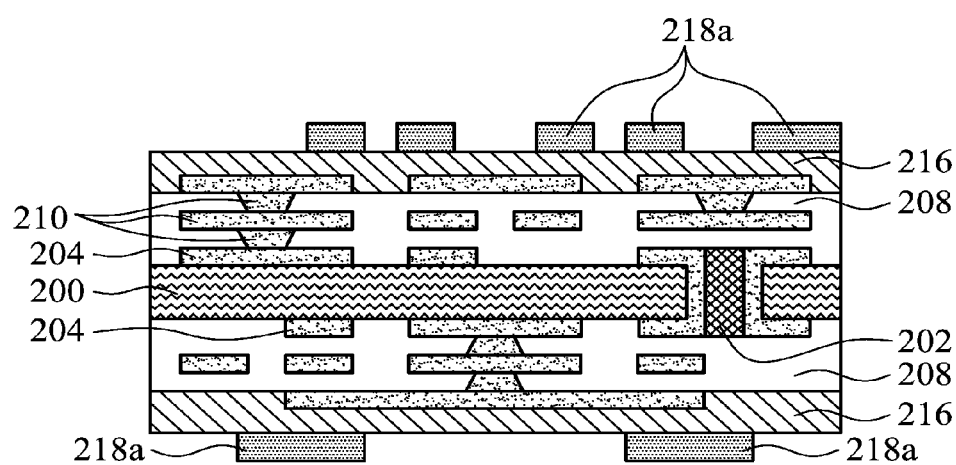

Alternatively, the conductive bump patterns may be immediately formed by a plating process. FIGS. 5a and 5b show a method for fabricating another exemplary embodiment of conductive bump patterns 218a. As shown in FIG. 5a, photoresist layers (not shown) may be formed on the first solder mask insulating layers 216 by pasting. A developing process is then performed to form photoresist patterns 220b and openings 224 on the first solder mask insulating layers 216, wherein the openings 224 are used to define formation positions of subsequent conductive bump patterns. Next, the conductive bump patterns 218a isolated from each other are formed on the first solder mask insulating layers 216 not covered by the photoresist patterns 220b by the plating process. Finally, a stripping process is performed to remove the photoresist patterns 220b. The conductive bump patterns 218a formed by methods as shown in FIGS. 4a, 4b, 5a and 5b serve as dummy conductive patterns isolated from the additional circuit structures 214.

Figure 6:
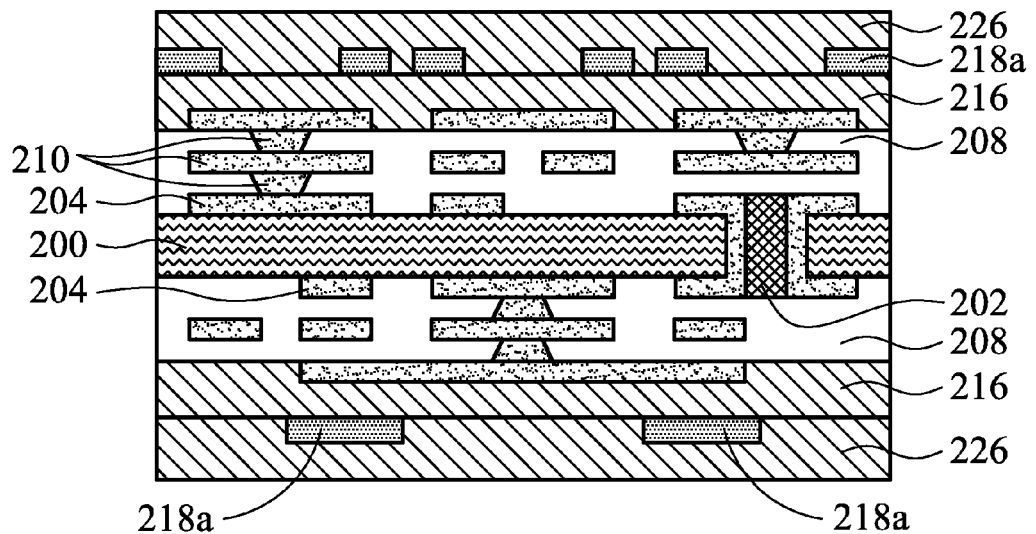

Next, referring to FIG. 6, a coating method may be used to form second solder mask insulating layers 226 on the first solder mask insulating layers 216, covering the conductive bump patterns 218a. In one embodiment, the first solder mask insulating layers 216 and the second solder mask insulating layers 226 may comprise the same materials. The first solder mask insulating layers 216 and the second solder mask insulating layers 226 may have the same or different thicknesses.

Figure 7:
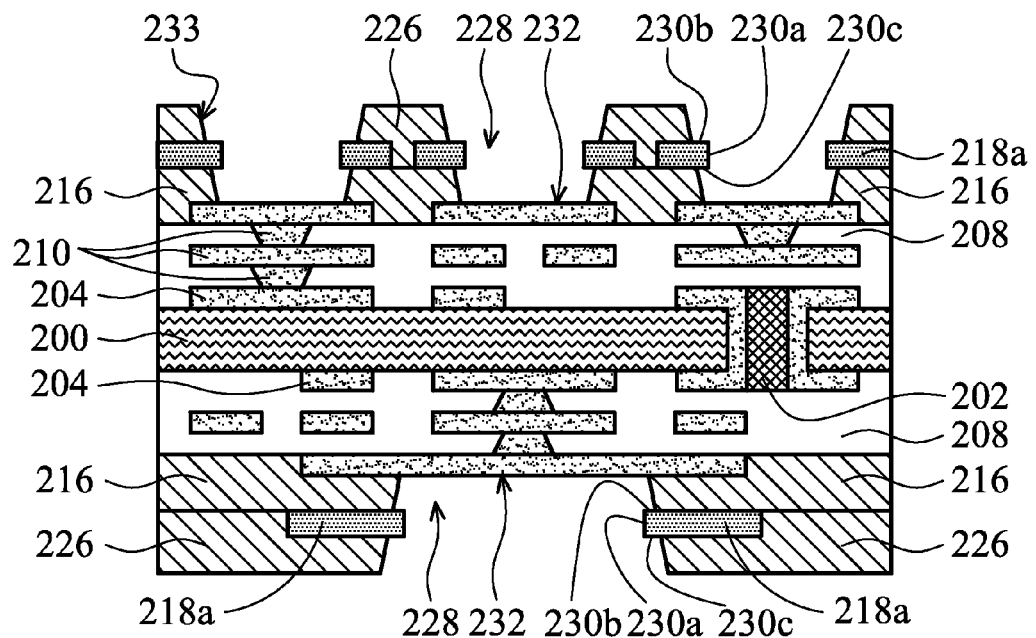

Next, referring to FIG. 7, openings 228 may be formed in the first solder mask insulating layers 216 and the second solder mask insulating layers 226 by laser drilling or plasma etching, wherein additional circuit structures 214 are exposed from the bottom sides 232 of the openings 228. The openings may serve as blind holes 228 of a printed circuit board. As shown in FIG. 7, the formation positions of the conductive bump patterns 218a partially overlap the formation positions of the openings 228. Therefore, a portion of the conductive bump patterns 218a may extend into the openings 228 horizontally, wherein a side 230a a portion of upper surface 230b and a portion of lower surface 230c of the each conductive bump pattern 218a are exposed from a sidewall 233 of each opening 228.

Figure 8:
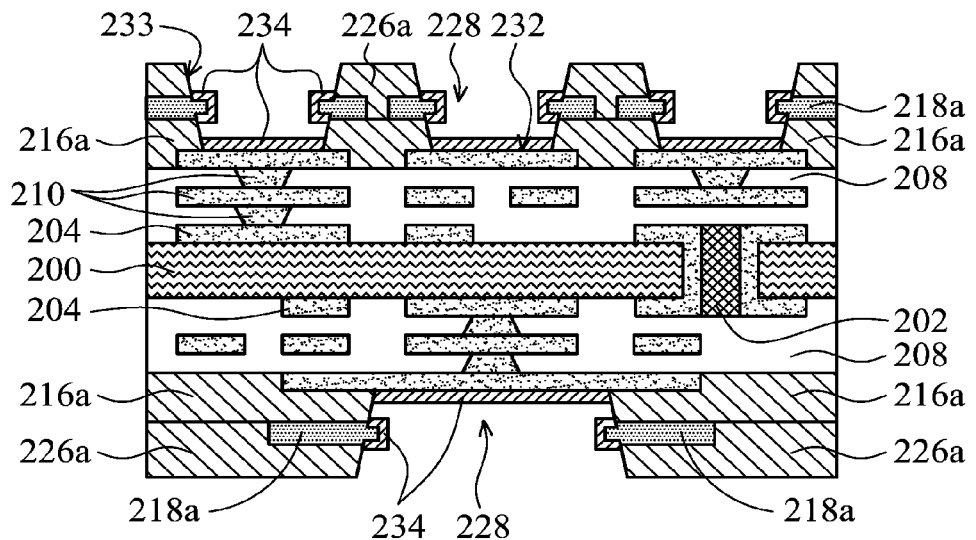

Next, referring to FIG. 8, protective layers 234 may be formed covering bottom sides 232 of the openings 228, the sides 230a, the portions of upper surface 230b and the portions of lower surfaces 230c of the conductive bump patterns 218a exposed from the openings 228. In one embodiment, the protective layer 234 may comprise Ni, Au, Sn, Pb, Cu, Ag, Cr, W, combinations thereof or alloys thereof.

Figure 9:
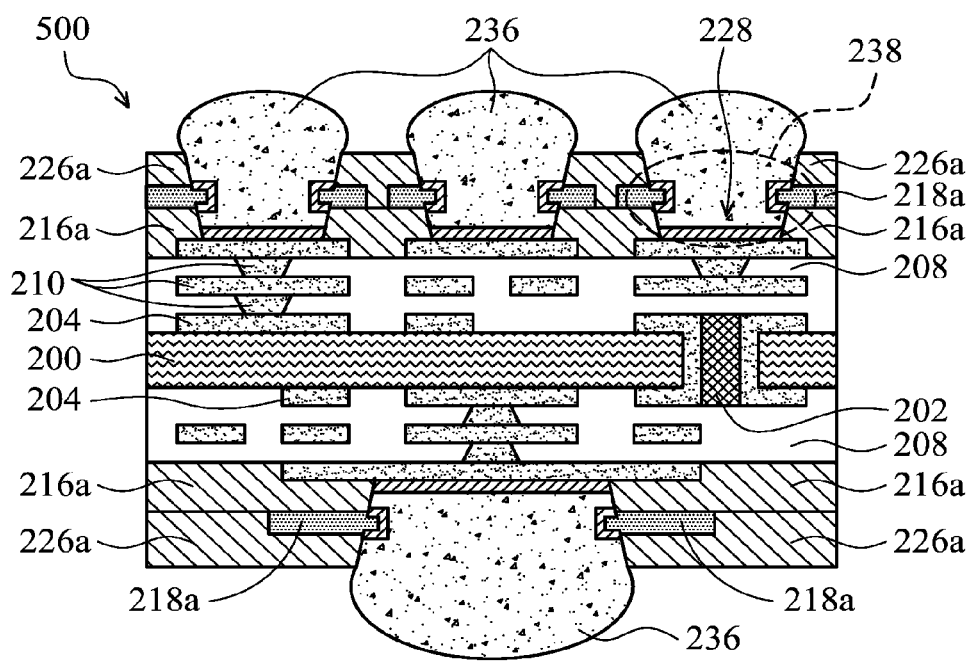

Next, referring to FIG. 9, printing molds having openings may be disposed over the second solder mask insulating layers 226, wherein the formation positions of the openings of the printing molds are substantially aligned to the positions of the openings 228. Next, solder paste may be scraped or squeezed into the openings of the printing molds, covering surfaces of the solder mask insulating layers 226 and the openings 228. Next, the solder paste on the surfaces of the solder mask insulating layers 226 and in the openings 228 is melted by a reflow process, forming solder balls 236 in the openings 228. The solder balls 236 are electrically connected to the additional circuit structures 214. After the aforementioned fabricating process, one exemplary embodiment of a printed circuit board 500 of the invention is completely formed. It is noted that one terminal of the conductive bump patterns 218a may extend into the openings 228 horizontally, increasing the roughness and contact area of the sidewall 233 of the opening 228 in the solder mask insulating layer. The solder ball 236 not only contacts the surface of the additional circuit structures 214, but also contacts the side 230a, the portion of the upper surface 230b and the portion of the lower surface 230c of the dummy conductive bump pattern 218a. Therefore, the bonding strength between the solder balls 236 and the substrate 200 are significantly increased. Also, the printed circuit board has improved reliability.

Figure 10A:
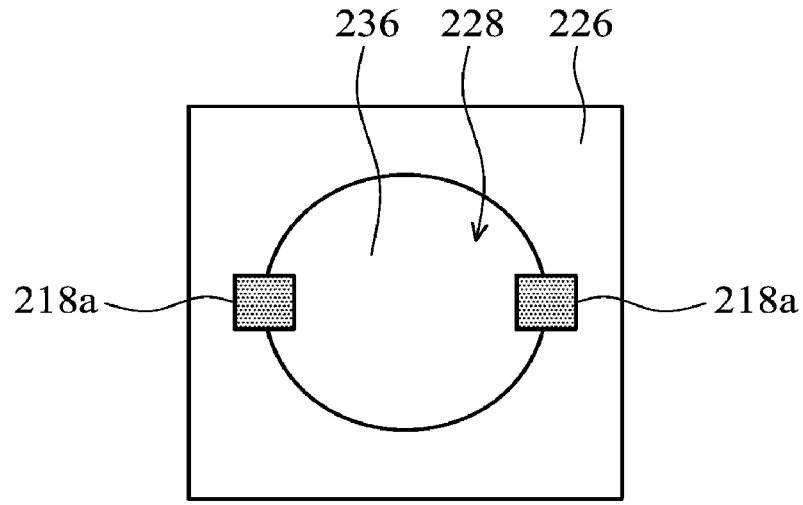
FIGS. 10a to 10i are top views showing exemplary embodiments of a conductive bump pattern having various shapes.
Figure 10B:
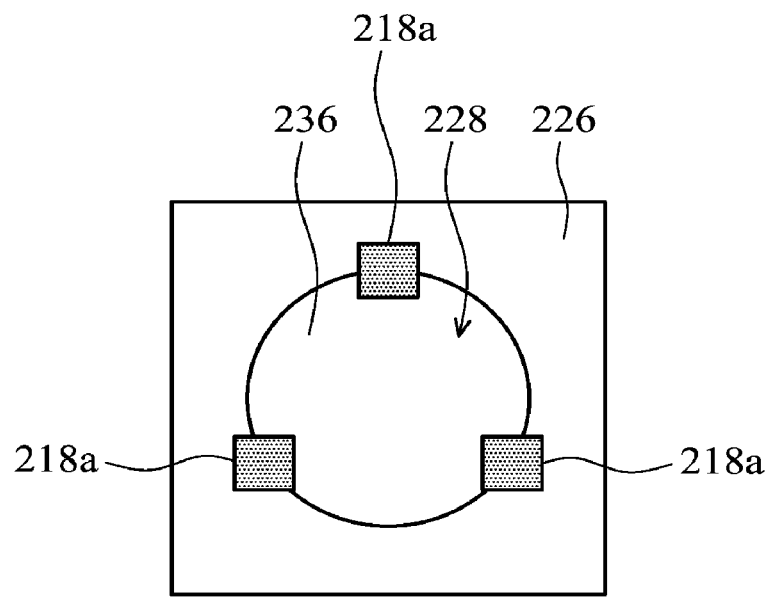
Figure 10C:
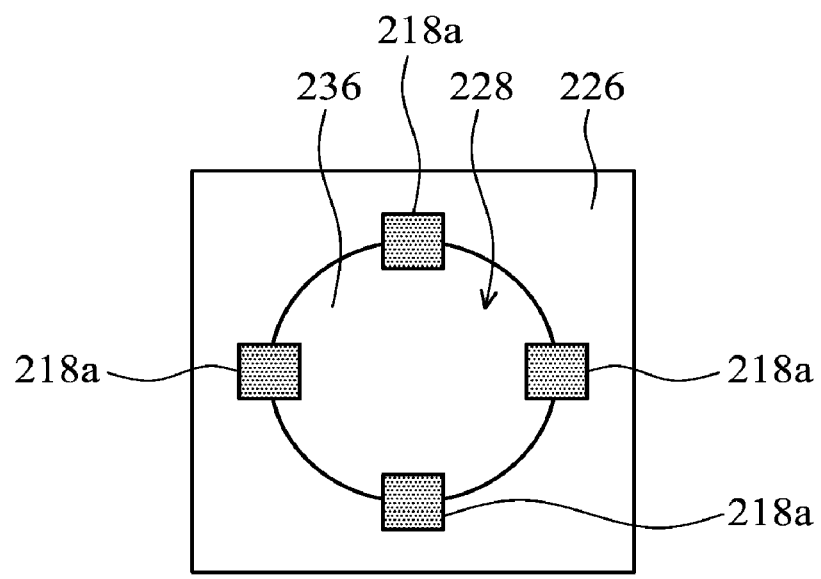
Figure 10D:
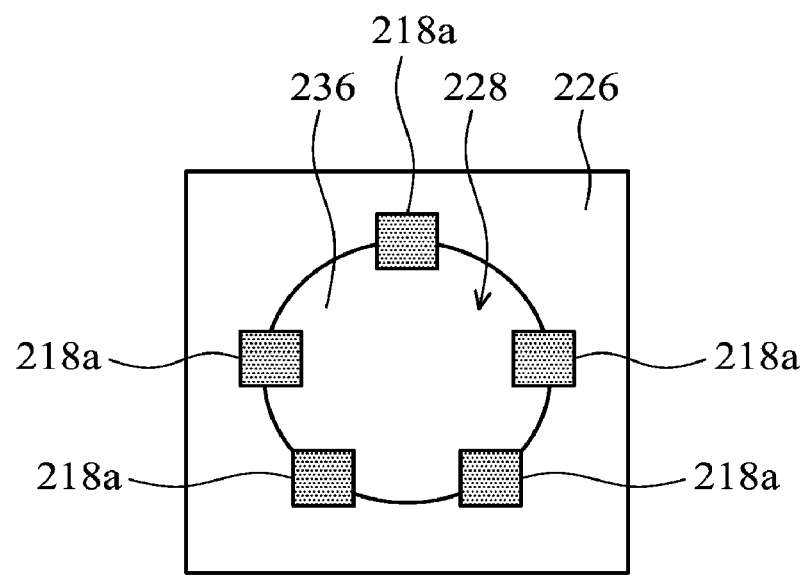
Figure 10E:
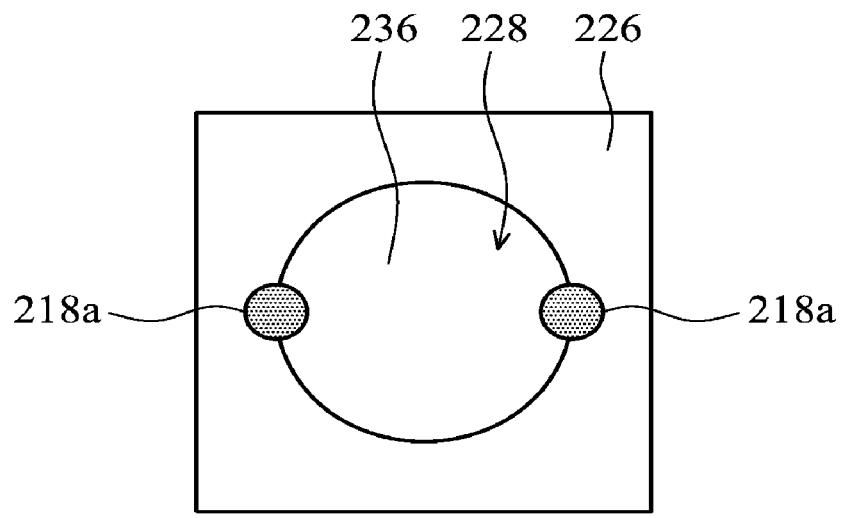
Figure 10F:
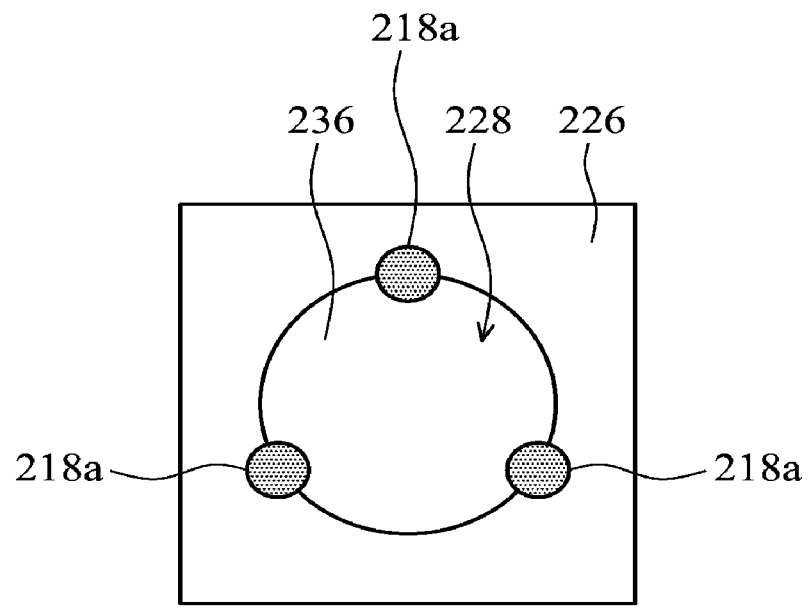
Figure 10G:
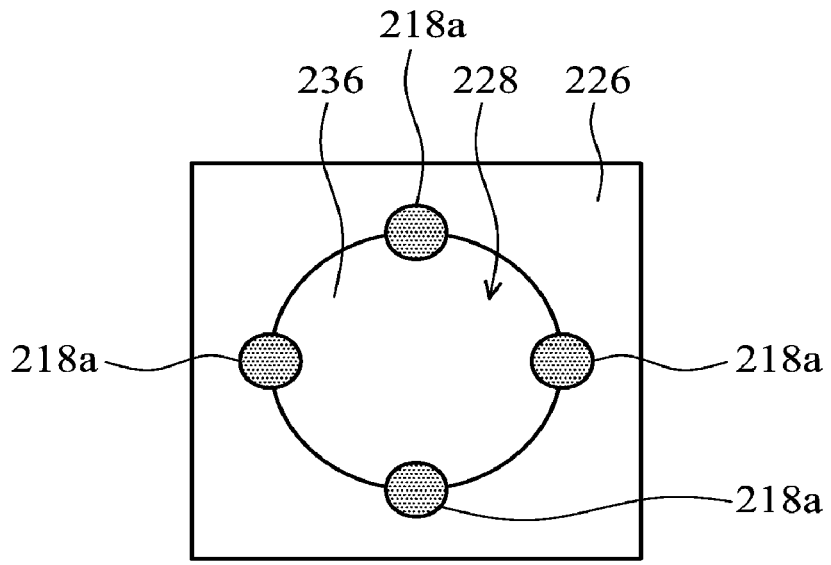
Figure 10H:
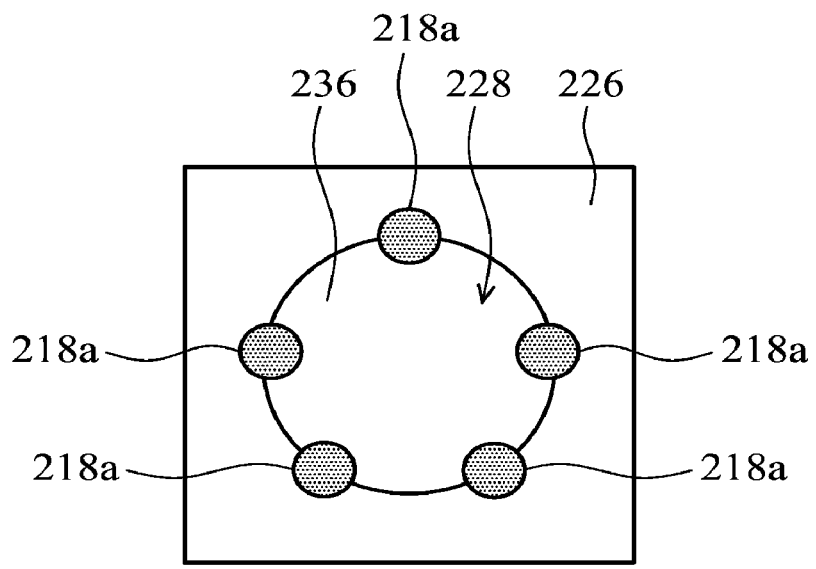
Figure 10I:
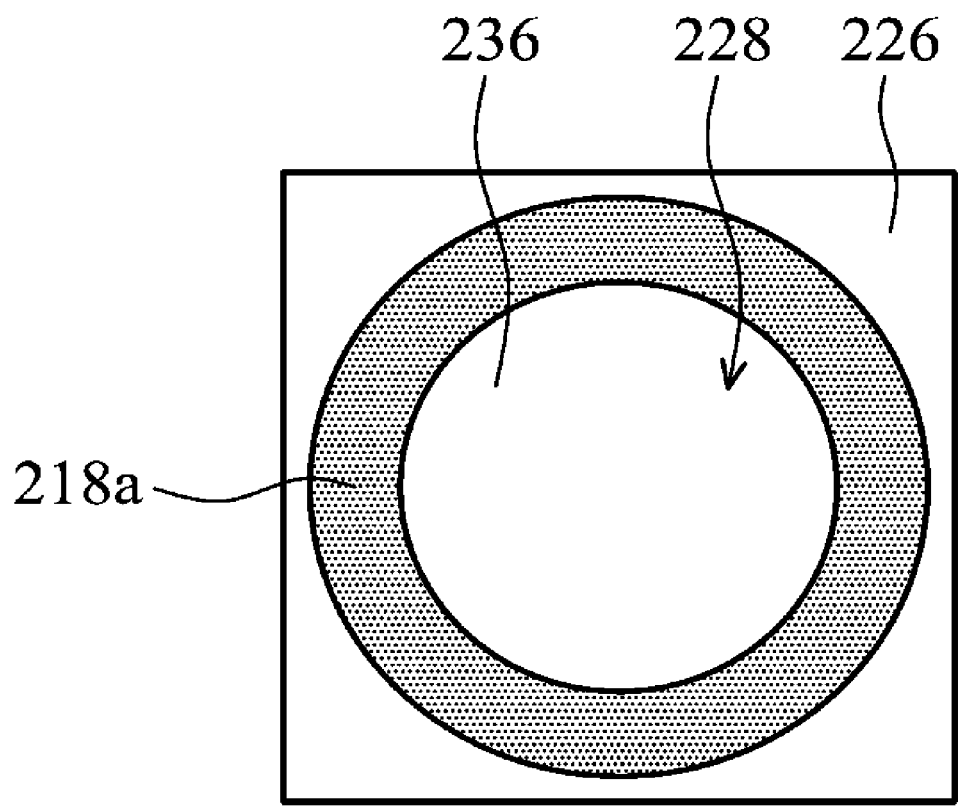

FIGS. 10a to 10i are top views of a portion 238 of the opening 228 serving as a blind hole as shown in FIG. 9, showing various shapes of the conductive bump pattern 218a. As shown in FIGS. 10a to 10i, the conductive bump pattern 218a may have shapes comprising a circular, quadrilateral or ring-like shapes. An inner side of the conductive bump pattern 218a as shown in FIG. 10i is entirely positioned in the opening 228. The conductive bump pattern 218a may have other shapes comprising an elliptical or polygonal shape, and is not limited, wherein a portion of the conductive bump pattern 218a extends into the opening 228 horizontally to increase the roughness of the sidewall 233 of the opening 228. Additionally, in some embodiments as shown in FIGS. 10a to 10i, the number of the conductive bump pattern 218a may be, for example, from one to five. However, the number of the conductive bump pattern 218a is not limited to the disclosed embodiments.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A printed circuit board, comprising:
    a substrate having an internal circuit structure;
    an additional circuit structure disposed on the substrate, electrically connected to the internal circuit structure;
    a solder mask insulating layer having an opening disposed on the additional circuit structure;
    a conductive bump pattern disposed in the solder mask insulating layer, wherein the conductive bump pattern extends into the opening horizontally, wherein a side, a portion of an upper surface and a portion of a lower surface of the conductive bump pattern are exposed from the opening, and wherein both the upper surface and the lower surface of the conductive bump pattern are not coplanar with a bottom side of the opening; and
    a solder ball formed in the opening, wherein the solder ball is electrically connected to the additional circuit structure.

2. The printed circuit board as claimed in claim 1, further comprising a protective layer covering a bottom side of the opening, the side of the conductive bump pattern, the portion of the upper surface of the conductive bump pattern and the portion of the lower surface of the conductive bump pattern exposed from the opening.

3. The printed circuit board as claimed in claim 1, wherein the solder ball connects to the side of the conductive bump pattern, the portion of the upper surface of the conductive bump pattern and the portion of the lower surface of the conductive bump pattern.

4. The printed circuit board as claimed in claim 1, wherein the conductive bump pattern is electrically isolated from the additional circuit structure.

5. The printed circuit board as claimed in claim 1, wherein the conductive bump pattern has a shape comprising a circular, elliptical, polygonal or ring-like shape.

6. The printed circuit board as claimed in claim 5, wherein an inner edge of the conductive bump pattern is exposed from the opening.

7. The printed circuit board as claimed in claim 1, wherein the additional circuit structure is exposed from the bottom side of the opening.

8. The printed circuit board as claimed in claim 1, wherein the substrate comprises a core material of paper phenolic resin, composite epoxy, polyimide resin or glass fiber.

9. The printed circuit board as claimed in claim 2, wherein the protective layer comprises Ni, Au, Sn, Pb, Cu, Ag, Cr, W or combinations thereof.

10. A method for fabricating a printed circuit board, comprising:
    providing a substrate having an internal circuit structure;
    forming an additional circuit structure on the substrate, wherein the additional circuit structure is electrically connected to the internal circuit structure;
    sequentially forming a first solder mask insulating layer, a conductive bump pattern and a second solder mask insulating layer on the additional circuit structure, wherein the conductive bump pattern is electrically isolated from the additional circuit structure;
    forming an opening in the first and second solder mask insulating layers, wherein a side, a portion of an upper surface and a portion of a lower surface of the conductive bump pattern are exposed from the opening, and wherein both the upper surface and the lower surface of the conductive bump pattern are not coplanar with a bottom side of the opening; and
    forming a solder ball in the opening, wherein the solder ball is electrically connected to the additional circuit structure.

11. The method for fabricating a printed circuit board as claimed in claim 10, wherein forming the conductive bump pattern further comprises:
    forming a conductive layer on the first solder mask insulating layer;
    forming a photoresist pattern covering the conductive layer;
    removing the conductive layer not covered by the photoresist pattern to form the conductive bump pattern; and
    removing the photoresist pattern.

12. The method for fabricating a printed circuit board as claimed in claim 10, wherein forming the conductive bump pattern further comprises:
    forming a photoresist pattern on the first solder mask insulating layer;
    forming the conductive bump pattern on the first solder mask insulating layer not covered by the photoresist pattern by a plating process; and
    removing the photoresist pattern.

13. The method for fabricating a printed circuit board as claimed in claim 10, further comprising forming a protective layer covering a bottom side of the opening, the side of the conductive bump pattern, the portion of the upper surface of the conductive bump pattern and the portion of the lower surface of the conductive bump pattern exposed from the opening.

14. The method for fabricating a printed circuit board as claimed in claim 10, wherein the solder ball connects to the side of the conductive bump pattern, the portion of the upper surface of the conductive bump pattern and the portion of the lower surface of the conductive bump pattern.

15. The method for fabricating a printed circuit board as claimed in claim 10, wherein the conductive bump pattern has a shape comprising a circular, elliptical, polygonal or ring-like shape.

16. A The method for fabricating a printed circuit board as claimed in claim 10, wherein an inner edge of the conductive bump pattern is exposed from the opening.

17. The method for fabricating a printed circuit board as claimed in claim 10, wherein the additional circuit structure is exposed from the bottom side of the opening.

18. The printed circuit board as claimed in claim 1, wherein the solder ball contacts the side and exposed portions of the upper surface and lower surface of the conductive bump pattern.

19. The method for fabricating a printed circuit board as claimed in claim 10, wherein the solder ball contacts the side and exposed portions of the upper surface and lower surface of the conductive bump pattern.

* * * * *